United States Patent [19]

Franz et al.

[11] 4,440,833
[45] Apr. 3, 1984

[54] COPPER-LAMINATED HARD PAPER MADE OF A FIRE RESISTANT LAMINATE

[75] Inventors: Arnold Franz, Troisdorf-Spich; Siegfried Koepnick, Troisdorf, both of Fed. Rep. of Germany

[73] Assignee: Dynamit Nobel Aktiengesellschaft, Troisdorf, Fed. Rep. of Germany

[21] Appl. No.: 437,305

[22] Filed: Oct. 28, 1982

[30] Foreign Application Priority Data

Oct. 30, 1981 [DE] Fed. Rep. of Germany ....... 3143121

[51] Int. Cl.$^3$ .................. B32B 27/00; B32B 15/10
[52] U.S. Cl. .................. 428/425.1; 428/425.3; 428/425.8; 428/464; 428/530; 428/921; 525/456; 528/45
[58] Field of Search ............ 428/921, 464, 530, 425.8, 428/425.3, 425.1; 525/456; 528/45

[56] References Cited

U.S. PATENT DOCUMENTS

| | | | |
|---|---|---|---|
| 3,713,879 | 1/1973 | Wu | 428/921 |
| 3,821,067 | 6/1974 | Taylor et al. | 428/921 |
| 3,933,759 | 1/1976 | Hoeschele | 528/45 |
| 3,962,521 | 6/1976 | Chang | 525/456 |
| 4,074,015 | 2/1978 | Franz | 428/921 |
| 4,256,795 | 3/1981 | Day | 525/456 |
| 4,260,514 | 4/1981 | Foucht | 428/921 |
| 4,400,483 | 8/1983 | Takahashi | 428/921 |
| 4,403,086 | 9/1983 | Holubka et al. | 525/456 |

Primary Examiner—George F. Lesmes
Assistant Examiner—E. Rollins Buffalow
Attorney, Agent, or Firm—Antonelli, Terry & Wands

[57] ABSTRACT

Increased elasticity of a laminate is obtained by adding 5–20% by weight of a blocked polyetherurethane component from a reaction product of polyethylene glycol, polypropylene glycol and p-nonylphenol with toluene-2,4-diisocyanate having the following composition:

| | |
|---|---|
| polyethylene glycol | 15–20% by weight |
| polypropylene glycol | 50–60% by weight |
| toluene-2,4-diisocyanate | 8–12% by weight |
| nonylphenol | 10–15% by weight | in the manufacture of a fire resistant laminate based on a cellulose-containing substrate material and an impregnating varnish made up of a phenol-resol with additives of plasticizers and flame retardants. A copper-laminated hard paper made of this phenolic resin laminate is distinguished by reduced punching resistance and stripping resistance.

4 Claims, No Drawings

COPPER-LAMINATED HARD PAPER MADE OF A FIRE RESISTANT LAMINATE

This invention relates to a copper-laminated hard paper of a fire resistant laminate based on a cellulose-containing substrate material and an impregnating varnish made up of a phenol-resol with additives of plasticizers and flame retardants.

Such laminates, formed on the basis of phenol-resol resins, partially with epoxide addition or on the basis of cresol-resol resins modified with wood oils, are produced in large quantities, particularly in the case of the phenol-resol resin system with dioctylphthalate or phosphoric acid ester as the plasticizer.

The production of laminated materials is conventional; in general, the first step of a known method is to impregnate a cellulose-containing material with phenolic resin and/or cresol resin solutions which optionally include plasticizers and/or flameproofing agents. The impregnated material is subsequently dried, during which step the resin continues to condense. Thereupon, several layers of this further condensed material are placed on top of one another and pressed with the use of heat and pressure to obtain the laminated material; during this procedure, the resin is cured.

The cellulose-containing material is preferably paper in the form of sheets or fibrous webs. The cellulose-containing material can, however, also be in the form of fleeces; it is also possible to replace this material partially or completely by fabrics, mats, or papers made from synthetic substances which can likewise form fibers, or by spun glass fibers or glass wool. Examples of the synthetic substances are polyesters or polyamides.

If the laminated materials are to be utilized as electric insulating material, for example as a substrate for printed circuits, individual layers are coated, by means of hot-melt adhesive, with a metallic foil, preferably a copper foil. The manufacture of such a composite material takes place generally simultaneously with the pressing step under heat and pressure.

These laminated materials are flameproofed by addition of flameproofing agents, among which melamine resins, urea resins, pentabromodiphenyl ether and/or other bromination products of diphenyl ether, tetrabromobisphenol A (which is, 2,2-bis (3,5-dibromo, 4-hydroxyphenyl) propan) or hexamethylenetetramine alone or in combination have proved to be especially effective.

While the mechanical and electrical quality and fire resistance of the copper-laminated papers manufactured on this basis are fully satisfactory, these systems cannot as yet fulfill all requirements with respect to improved cold-punching ability, decreased crack formation, especially in the production of groups of punched holes for integrated circuits as well as with respect to negligible hole blockage.

In a continued investigation of these properties, it has been found that the best values regarding cold-punching ability in the cold-punching of holes having a diameter of 0.8 mm, without hole clogging and while simultaneously meeting the standard IEC 249-2-7 FVO, are achieved maximally well by resols plasticized during the resin manufacture by the chemical addition of wood oil, linseed oil, or fatty acids. The production of such resins, however, is comparatively expensive, and such resins are unsuitable for single impregnations.

This invention is directed to the object of providing a copper-laminated hard paper having improved cold-punching ability and a low required punching resistance, without hole clogging, while meeting physical properties corresponding to IEC 249-2-7-FVO.

This object has been attained according to this invention by producing a copper-laminated hard paper of a fire resistant laminate comprised of a cellulose-containing substrate and an impregnating varnish containing a phenol-resol resin and a polyurethane polymer in certain weight proportions.

A copper-laminated hard paper that is especially preferred is one wherein the impregnating varnish has the following composition:

| | |
|---|---|
| ammoniacal-condensed phenol-resol resin | 40–42% by weight |
| low-molecular phenol resin | 8–12% by weight |
| diphenyl cresyl phosphate | 28–32% by weight |
| hexamethylenetetramine | 1–4% by weight |
| tetrabromobisphenol A | 3–5% by weight |
| and a blocked polyetherurethane with a molecular weight of about 3000 to 7000 g/mol comprised of a reaction product of polyethylene glycol, polypropylene glycol, and p-nonylphenol with toluene-2,4-diisocyanate | 10–20% by weight. |

The use of the blocked polyetherurethane component as required by this invention imparts to the thus-modified copper-laminated hard papers, based on the above-indicated phenol-resol resin system, a superior cold-punching ability. Furthermore, the force, based on a needle, to be expended by the punching device in order to pull the punching needle out of the laminate is likewise considerably reduced. With the copper-laminated hard papers made up, according to this invention, of polyurethane-modified phenol-resol resin systems, the punching force and the stripping force, as well as the noise produced during the punching operation, can be considerably reduced, and the lifetime of the punching needles can be substantially lengthened.

The blocked polyetherurethane component utilized in accordance with the invention reacts with the aforedescribed phenol-resol resin and thus imparts an elasticity not achieved previously by pure phenolic resins used in the field of laminate manufacture. This elasticity was known heretofore only in cresol-phenol resins modified by wood oil, linseed oil, or fatty acids. With the use of such resin types, however, steps must be taken with regard to process technology and pollution control, which are not required to this extent when using the polyurethane-modified phenol-resol system of this invention. However, it has been found that the quantitative ratios of the blocked polyetherurethane component to be employed and the structure of the system as a whole are definitely critical with regard to the other technical requirements to be met by a laminate. In particular, the following requirements have to be met:

thorough homogenization of the impregnating varnish system with the substrate material for providing adequate transparency of the thus-manufactured laminates;

low water absorption lying within specifications;

adequate thermal stability;

satisfactory layer adhesion and shelf stability of the prepregs;

classification into flammability grade according to UL 94 VO;

minor buckling;

low shrinkage; and adequate bending strength.

To achieve these requirements, a number of measures, discussed below, have been considered. The starting point is an impregnating varnish based on a phenol-resol resin system according to our U.S. Pat. No. 4,074,015. In particular, an optimum had to be found regarding the content of hexamethylenetetramine to avoid incompatibility with the blocked polyetherurethane component used according to this invention, as well as with regard to the shelf stability of the prepregs. The proportion of low-molecular phenol-resol is determining for the impregnating effect and thus also for the specification of water absorption and dielectric properties.

Furthermore, the incorporation of epoxy resins was considered for improving thermostability. The addition of epoxy resins, however, leads again to a rise in punching resistance and stripping resistance, and, furthermore, the prepregs with impregnating varnishes containing epoxy resins exhibit, in part, even after only 24 hours of storage time of the impregnated papers, no adequate bonding of the individual prepregs during the pressing operation.

The tables set out below give an overview of these relationships and contain one example (No. 1), as well as four comparative examples (Nos. 2, 3, 4, 5).

The procedure used for making the phenol-resol resin system, designated as component (A) in Table 1 is by condensation in the temperature range between 80° and 95° C. to the point of onsetting precipitation of phenol with formaldehyde in a molar ratio between 1:0.9 and 1:1 in presence of 2 to 3% ammonia as catalyst on the basis of the initial amount of phenol at temperatures between 80° C. and the boiling temperature of the reaction mixture, where from the start of the condensation the temperature can be for 10 minutes at a value of 100° C., subsequent vacuum distillation until the distillate has a viscosity of 3600 to 4500 mPas.

The low-molecular weight phenolic resin of the type designated as component (B) in Table 1 and used in examples 1, 4 and 5 is a commercial product, which is supplied by several manufacturers.

This resin (component (B) in Table 1 is a cold-condensed (at about 20° C.) phenol formaldehyde resin and preferably barium hydroxide is utilized as the catalyst. The curing reaction does not proceed much further than to the stage of formation of methylol groups, resulting in a very low average molecular weight of the resin component. By precipitation with phosphoric acid or sulfuric acid and filtration this resin system with the indicated catalyst is made electrolyte-free.

The "(I)" designated "Other materials" are 5% Wt. of an epoxy novolak in the case of comparative Example 4 and 4.0% Wt. of an epoxy novolak together with 0.3% of an amine curing agent in the case of comparative Example 5.

In Table 1, the recipe of a varnish composition of this invention is set forth as Example 1, and Examples 2, 3, 4 and 5 illustrate varnish compositions which are not within the purview of the compositions according to this invention and are no longer acceptable with respect to various specifications.

TABLE 1

| | Raw Materials | Unit | Example 1 | Comparative Examples 2 | 3 | 4 | 5 |
|---|---|---|---|---|---|---|---|
| | (Solids Proportion) | | | | | | |
| (A) | Ammoniacal-condensed phenol-resol resin (1) | % Wt. | 40 | 61 | 50 | 39 | 40.7 |
| (B) | Low-molecular phenolic resin (2) | % Wt. | 10 | — | — | 10 | 10 |
| (C) | Diphenyl cresyl phosphate | % Wt. | 30 | 33 | 30 | 30 | 30 |
| (D) | Epoxy resin, liquid (3) | % Wt. | — | — | 5 | — | — |
| (E) | Polyurethane (4) | % Wt. | 14 | — | 15 | 10 | 10 |
| (F) | Hexamethylenetetramine | % Wt. | 3 | 6 | — | — | 1 |
| (G) | Tetrabromobisphenol A | % Wt. | 3 | — | — | 3 | 4 |
| (H) | Pentabromodiphenyl ether | % Wt. | — | — | — | 3 | — |
| (I) | Other materials | % Wt. | — | — | — | 5 | 4.3 |
| | Solvent Proportion | | | | | | |
| (a) | Methanol | % Wt. | — | 20 | 20 | — | — |
| (b) | Ethanol | % Wt. | — | — | — | — | — |
| (c) | Acetone | % Wt. | 25 | — | — | 25 | 25 |

(1) Supplier: Dynamit Nobel Aktiengesellschaft, Type T 55
(2) Supplier: Bakelite Gesellschaft mbH, Bakelite-Harz, Type 2448
(3) Supplier: Duroplast-Chemie GmbH, Epoxidnovolak, Type 5038
(4) 20 Wt. % of polyethylene glycol; 57 Wt. % of polypropylene glycol 11 Wt. % of p-nonylphenol; and 12 Wt. % of toluene-2,4-diisocyanate, Type DN 317

In Table 2, there is a summary of the properties obtained by evaluation of copper-laminated hard papers obtained by laminating a copper foil or sheet of 1.5 mm thickness to a cellulose-containing substrate formed of 6 paper layers impregnated and bonded with phenol-resol varnish systems obtained from the recipes given in Examples 1, 2, 3, 4 and 5. (The laminates were cured at 150° C. for 90 minutes with a pressure of 120 bar.)

The transparency (color wedge method) is an internal test method of DYNAMIT NOBEL and ranges from grade 1, which means "transparent", to grade 5, which means milky or non-transparent.

The term layer bonding characterizes the tendency of copper-laminated hard papers to delaminate as a result of the punching process.

The items (4) Solder bath 260° C. (5) $H_2O$ Absorption, (11) Bending strength-longitudinal and (12) Bending strength-transverse in Table 2 are defined in DIN 40 802, whereas DIN means German Industrial Standard.

TABLE 2

| | Properties | Unit | Example 1 | Comparative Examples 2 | 3 | 4 | 5 |
|---|---|---|---|---|---|---|---|
| (1) | General appearance | — | Very Transparent | Clear, Homogeneous | Very Transparent | Slightly Cloudy | Very Transparent |
| (2) | Transparency (color wedge method of Dynamit Nobel) | Grade | 1 | 2 | 1 | 1 | 1 |
| (3) | Layer bonding | Grade | 1 | 1 | 1 | 1 | 1 |
| (4) | Solder bath 260° C. (DIN 40 802) | sec. | 30 | 15 | 30 | 12 | 50 |
| (5) | $H_2O$ Absorption (DIN 40 802) | mg | 50 | 45 | 90 | 50 | 40 |
| (6) | Internal resistance · $10^{10}$ according to D 96/23 | Ω (Ohm) | 3 | 0.5 | 0.001 | 0.9 | 10 |
| (7) | Flammability classification | UL 94 | V 0 | V 0 | HB | V 1 | V 1 |

TABLE 2-continued

| Properties | | Unit | Example 1 | Comparative Examples | | | |
|---|---|---|---|---|---|---|---|
| | | | | 2 | 3 | 4 | 5 |
| (8) | Shelf like prepreg | Days | >180 | >365 | 1 | 6 | 12 |
| (9) | Punching resistance (Dynamit Nobel method) | Newton (N) | 380 | 500 | 360 | 400 | 360 |
| (10) | Stripping resistance (Dynamit Nobel method) | N | 90 | 160 | 60 | 100 | 80 |
| (11) | Bending strength - longitudinal (DIN 40 802) | N/mm$^2$ | 145 | 145 | 100 | 145 | 120 |
| (12) | Bending strength - transverse (DIN 40 802) | N/mm$^2$ | 120 | 125 | 80 | 120 | 100 |

As contrasted to Comparative Example 2, a marked improvement in punching resistance and stripping resistance can be found for the laminate produced by using the varnish of the present invention, particular attention being invited to the low punching resistance of 380 N and the low stripping resistance of 90 N obtained by Example 1. As contrasted to Comparative Examples 3, 4 and 5, comparable punching resistance and stripping resistance exist, but these compositions do not meet requirements regarding flammability class VO and regarding the shelf life of the prepregs. Moreover, Comparative Example 3 is clearly poorer with respect to water absorption and internal resistance.

We claim:

1. A copper-laminated hard paper comprising a fire resistant laminate formed of a cellulose-containing substrate material and an impregnating varnish of a phenol-resol with additives of plasticizers and flame retardants, said impregnating varnish having the following composition, by weight:

| | |
|---|---|
| ammoniacal-condensed phenol-resol resin | 35–50% |
| low-molecular phenolic resin | 0–12% |
| diphenyl cresyl phosphate | 20–35% |
| hexamethylenetetramine | 1–6% |
| tetrabromobisphenol A | 0–5% |
| pentabromodiphenyl ether | 0–3% |
| and a blocked polyetherurethane component comprised of a reaction product of polyethylene glycol, polypropylene glycol and p-nonylphenol with toluene-2,4-diisocyanate having the following composition, by weight | 5–20% |
| polyethylene glycol | 15–20% |
| polypropylene glycol | 50–60% |
| toluene-2,4-diisocyanate | 8–12% |
| nonylphenol | 10–15% |

2. A copper-laminated hard paper according to claim 1, wherein the impregnating varnish contains 40–42% by weight ammoniacal-condensed phenol-resol resin, 8–12% by weight low-molecular phenolic resin, 28–32% by weight diphenyl cresyl phosphate, 1–4% by weight hexamethylenetetramine, 3–5% by weight tetrabromobisphenol A, and 10–15% by weight of the blocked polyetherurethane component.

3. An impregnating varnish for producing hard paper laminates which contains, by weight:

| | |
|---|---|
| ammoniacal-condensed phenol-resol resin | 35–50% |
| low-molecular phenolic resin | 0–12% |
| diphenyl cresyl phosphate | 20–35% |
| hexamethylenetetramine | 1–6% |
| tetrabromobisphenol A | 0–5% |
| pentabromodiphenyl ether | 0–3% |
| and a blocked polyetherurethane component comprised of a reaction product of polyethylene glycol, polypropylene glycol and p-nonylphenol with toluene-2,4-diisocyanate having the following composition, by weight | 5–20% |
| polyethylene glycol | 15–20% |
| polypropylene glycol | 50–60% |
| toluene-2,4-diisocyanate | 8–12% |
| nonylphenol | 10–15% |

4. An impregnating varnish according to claim 3, wherein said impregnating varnish contains 40–42% by weight ammoniacal-condensed phenol-resol resin, 8–12% by weight low-molecular phenolic resin, 28–32% by weight diphenyl cresyl phosphate, 1–4% by weight hexamethylenetramine, 3–5% by weight tetrabromobisphenol A, and 10–15% by weight blocked polyetherurethane component.

* * * * *